United States Patent [19]
Noboru

[11] Patent Number: 4,955,076
[45] Date of Patent: Sep. 4, 1990

[54] LOW NOISE CONVERTER
[75] Inventor: Mitsuhiro Noboru, Sakai, Japan
[73] Assignee: Sharp Kabushiki Kaisha, Osaka, Japan
[21] Appl. No.: 223,614
[22] Filed: Jul. 25, 1988
[30] Foreign Application Priority Data Jul. 27, 1987 [JP]  Japan .......................... 62-115479[U]

[51] Int. Cl.⁵ ........................ H04B 11/16; H04B 1/16
[52] U.S. Cl. .................................... 455/188; 455/189; 455/343
[58] Field of Search ............... 455/133, 150, 168, 176, 455/184, 188, 222, 180, 343, 189

[56]  References Cited
U.S. PATENT DOCUMENTS 3,755,743  8/1973  McLernon .
3,924,192 12/1975  George ............................... 455/180
4,180,804 12/1979  Watanabe et al. .
4,476,439 10/1984  Sato ..................................... 455/188
4,672,687  6/1987  Horton et al. ...................... 455/133

OTHER PUBLICATIONS

"A Solid-State Relay For Transformer Switching", Jamil-Asghar et al., Int'l. Journal of Electronics 61 (1986) Oct., No. 4, London, Great-Britian, pp. 539–542.

Primary Examiner—Reinhard J. Eisenzopf
Assistant Examiner—Curtis Kuntz

[57]  ABSTRACT

A two-band low noise frequency converter coupled, for example, to RF signals from a satellite and receiving at least two frequency bands therefrom including relay switch means for switching from one frequency band to another and control means which is responsive to the low level of a bi-level power-supply voltage being fed through an IF output terminal to operate the switch means. This reduces the power consumption and the heat generated thereby.

4 Claims, 1 Drawing Sheet

LOW NOISE CONVERTER

BACKGROUND OF THE INVENTION

The present invention relates to a low noise converter (Low Noise Block Downconverter: hereinafter referred to as utilized, for example "LNB")for receiving at least two frequency bands from a satellite television broadcast down link, and more particularly, to a construction of an LNB for switching a receiving band in accordance with a predetermined change in the level of a power-supply voltage.

Conventionally, as is shown in FIG. 2, and as further shown and described in applicant's related copending application Ser. No. 07/200,558, entitled "Outdoor Unit Low Noise Converter For Satellite Broadcast Reception Use", filed on May 31, 1988 a power-supply voltage fed through an IF output terminal, is sensed by a coil L. The sensed power-supply voltage is divided by resistors R1 and R2, and is compared with a reference voltage by a comparator 2. The reference voltage is coupled through a voltage stabilizer from the power-supply voltage.

When the output of the comparator 2 is higher than the reference voltage and higher than the threshold voltage of a transistor TR, the transistor TR is switched on i.e. rendered. By this action a relay 3 operating as a switch relay switches the receiving frequency band to another band of receiving frequencies. R3 is a resistor to effect a stable hysteresis characteristic. D is a diode to protect the transistor TR. C is a condenser to block a direct current. The, output of a three-terminal regulator 4 is supplied to each circuit, not shown, inside the LNB.

It is to be noted, however, that with the above conventional circuit, the relay 3 is operated when the switching power-supply voltage level is high. This causes an increase of power consumption and further causes a temperature rise inside the LNB.

SUMMARY OF THE INVENTION

Accordingly, it is an object of the present invention to provide an LNB which operates a frequency band switching relay when an applied power-supply voltage is low for reducing power consumption.

Briefly described, in accordance with the present invention, a 2-band LNB coupled to a satellite transmitting RF signals therefrom includes relay switch means for switching a received frequency band and relay control means which is responsive to the level of an applied power-supply voltage being fed through an IF output terminal and operates to energize the relay switch means and change the band of the received frequencies when the level of the power supply voltage is the lesser of two predetermined voltage levels.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE PREFERRED EMBODIMENTS

Figure 1:
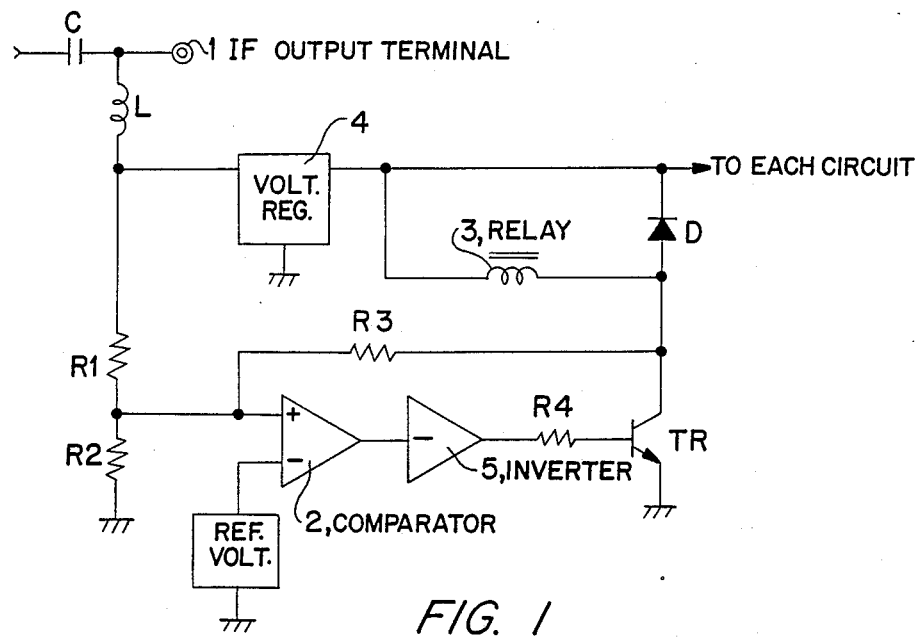
FIG. 1 is a circuit diagram which shows an embodiment of the present invention.
Figure 2:
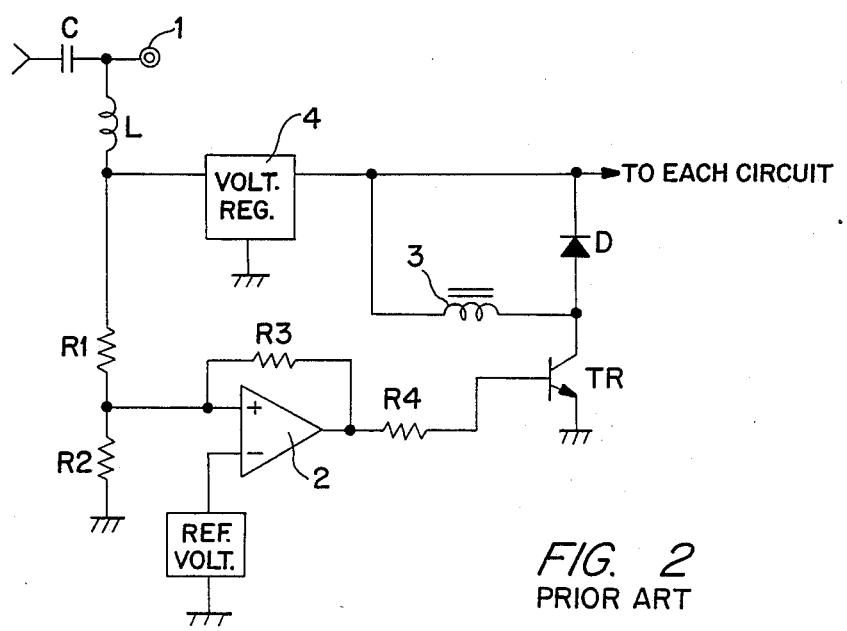
FIG. 2 is a circuit diagram showing a conventional example.

Like reference characters in FIG. 1 designate corresponding parts to those shown in FIG. 2.

FIG. 1 is a circuit diagram showing an embodiment of the present invention comprising a received frequency band switching circuit in a low noise frequency converter. As shown, comparator 2 compares the level of the power-supply voltage appearing across the resistors R1 and R2 with a reference voltage as before and as described with respect to FIG. 2. The output of the comparator 2, however, is now inverted by an inverter 5. Again when the output of the inverter 5 is higher than a threshold voltage, the transistor TR is switched on and the coil of the relay 3 is operated i.e. energized.

As is described above and due to the inverter 5, the relay 3 is now operated when the power-supply voltage is at a low level rather than a high level. Although circuit current increases the power-supply voltage is relatively low and, the power consumption (product of current and power-supply voltage) is reduced from that heretofore. Consequently, temperature rise inside the 2-band LNB is minimized.

For example, when the operating current of the relay 3 is 10 mA, the current for portion of the circuitry without the relay 3 is 150 mA. The level of the power-supply source voltage for a low voltage is 13 V while the power-supply source voltage for the high voltage level is 17 V for the conventional circuit as shown in FIG. 2 (in which the relay 3 is operated when the voltage is high), the power consumption for low voltage is 13 V×0.15 A=1.95 W while power consumption for high voltage is 17 V×(0.15 +0.01) A=2.72 W. On the other hand, in a circuit of the present invention as shown in FIG. 1, the power consumption for low voltage is 13 V×(0.15+0.01) A=2.08 W, while the power consumption for high voltage is 17 V×0.15 A=2.55 W.

The largest power consumption of each case is: the conventional circuit (FIG. 2)—2.72 W; the present embodiment (FIG. 1)—2.55 W. As power i.e. heat consumption reflects calorific power, the present invention consumes less electric power and therefore causes less heat generation.

In the present embodiment, an inverter 5 is used, but instead of an inverter, it is also possible to obtain the same mode of operation by inverting the polarity of the input to the comparator 2.

As described above, and according to the present invention, the relay 3 is operated when a power-supply source voltage applied to one input of the comparator 2 is low. Therefore, a useful 2-band LNB is provided where the power consumption is reduced, and at the same time the heat generation inside the LNB is reduced.

While certain embodiments of the present invention have been described, it will be apparent to those skilled in the art that various changes and modifications may be made therein without departing from the spirit and scope of the present invention as claimed.

What is claimed is:

1. In a low noise frequency converter receiving at least two frequency bands from a source of RF signals, a band switching circuit comprising:
   means for feeding a power supply voltage of an alternately high and low voltage level to an IF output terminal depending on the frequency band desired to be received;

switch means for switching said frequency bands received from one frequency band to another;

a voltage comparator including a first and second input terminals and an output terminal;

means for coupling said power supply voltage to said first input terminal;

means for supplying a reference voltage to said second input terminal; and means coupled to said output terminal of said voltage comparator for energizing said switch means with said power supply voltage when said power supply voltage is at said low voltage level thereby changing from one frequency band to another, said switch means being deenergized when said power supply voltage is at said high voltage level for reducing heat generated by said switch means.

2. The band switching circuit as defined in claim 1, wherein said first input terminal comprises a non-inverting signal terminal, said second input terminal comprises an inverting signal terminal and wherein said means coupled to said output terminal of said voltage comparator includes a signal inverter, said signal inverter generating an output signal when said power supply voltage is at said low voltage level to energize said switch means.

3. The band switching circuit as defined by claim 2, wherein said switch means comprises a relay.

4. The band switching circuit as defined by claim 3, wherein said means coupled to said output terminal of said voltage comparator includes a transistor coupled between said signal inverter and said relay, said transistor rendered conductive by said output signal when said power supply voltage is at said low voltage level to energize said relay.

* * * * *